(12) United States Patent
Marin et al.

(10) Patent No.: US 10,290,557 B2
(45) Date of Patent: May 14, 2019

(54) SELECTIVE METALLIZATION OF AN INTEGRATED CIRCUIT (IC) SUBSTRATE

(71) Applicant: Intel Corporation, Santa Clara, CA (US)

(72) Inventors: Brandon C. Marin, San Diego, CA (US); Trina Ghosh Dastidar, Chandler, AZ (US); Dilan Seneviratne, Chandler, AZ (US); Yonggang Li, Chandler, AZ (US); Sirisha Chava, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/549,970

(22) PCT Filed: Mar. 9, 2015

(86) PCT No.: PCT/US2015/019524
§ 371 (c)(1),
(2) Date: Aug. 9, 2017

(87) PCT Pub. No.: WO2016/144320
PCT Pub. Date: Sep. 15, 2016

(65) Prior Publication Data
US 2018/0033707 A1 Feb. 1, 2018

(51) Int. Cl.
*H05K 3/10* (2006.01)
*H01L 23/14* (2006.01)
(Continued)

(52) U.S. Cl.
CPC .......... *H01L 23/14* (2013.01); *H01L 21/4846* (2013.01); *H01L 23/145* (2013.01);
(Continued)

(58) Field of Classification Search
CPC ........ H05K 1/0373; H05K 3/10–3/207; H05K 2201/026; H05K 2201/0206–2201/0272; H05K 2203/107
See application file for complete search history.

(56) References Cited

U.S. PATENT DOCUMENTS 5,139,818 A 8/1992 Mance
6,156,221 A 12/2000 Lauffer et al.
(Continued)

FOREIGN PATENT DOCUMENTS

CN 101894823 A 11/2010
TW 201138197 A 11/2011
WO 2014125470 A1 8/2014

OTHER PUBLICATIONS

Search Report dated Feb. 14, 2017 for Taiwan Application No. 105100678, 2 pages.
(Continued)

*Primary Examiner* — Eric A. Ward
(74) *Attorney, Agent, or Firm* — Schwabe, Williamson & Wyatt, P.C.

(57) ABSTRACT

Embodiments of the present disclosure describe selective metallization of an integrated circuit (IC) substrate. In one embodiment, an integrated circuit (IC) substrate may include a dielectric material and metal crystals having a polyhedral shape dispersed in the dielectric material and bonded with a ligand that is to ablate when exposed to laser light such that the metal crystals having the ablated ligand are activated to provide a catalyst for selective electroless deposition of a metal. Other embodiments may be described and/or claimed.

22 Claims, 3 Drawing Sheets

(51) Int. Cl.
*H05K 3/06* (2006.01)
*H05K 3/18* (2006.01)
*H01L 23/498* (2006.01)
*H01L 21/48* (2006.01)

(52) U.S. Cl.
CPC .. *H01L 23/49822* (2013.01); *H01L 23/49866* (2013.01); *H05K 3/062* (2013.01); *H05K 3/105* (2013.01); *H05K 3/185* (2013.01); *H01L 2224/16227* (2013.01); *H01L 2224/32225* (2013.01); *H01L 2224/48227* (2013.01); *H01L 2224/73204* (2013.01); *H01L 2924/15311* (2013.01); *H05K 3/107* (2013.01); *H05K 3/182* (2013.01); *H05K 2201/0209* (2013.01); *H05K 2201/0236* (2013.01); *H05K 2203/107* (2013.01)

(56) References Cited

U.S. PATENT DOCUMENTS

| | | | |
|---|---|---|---|
| 6,319,564 B1 | 11/2001 | Naundorf et al. | |
| 6,521,285 B1 | 2/2003 | Biebuyck et al. | |
| 7,294,449 B1 | 11/2007 | Gudeman et al. | |
| 7,718,273 B2* | 5/2010 | Fujii | B32B 5/16 174/259 |
| 7,906,200 B2* | 3/2011 | Tseng | H05K 3/045 174/255 |
| 2003/0031803 A1 | 2/2003 | Belouet et al. | |
| 2006/0211187 A1 | 9/2006 | Choi et al. | |
| 2007/0014975 A1* | 1/2007 | Ota | C23C 18/14 428/209 |
| 2009/0263639 A1 | 10/2009 | Dunbar et al. | |
| 2011/0048783 A1* | 3/2011 | Yu | H05K 3/0035 174/261 |
| 2012/0074094 A1* | 3/2012 | Chiang | H01L 21/4846 216/18 |
| 2012/0134631 A1* | 5/2012 | Chiang | B29C 45/0013 385/88 |
| 2014/0296410 A1 | 10/2014 | Cheng et al. | |
| 2015/0122533 A1* | 5/2015 | Kao | H05K 3/4661 174/257 |
| 2015/0125674 A1* | 5/2015 | Brust | C23C 18/1612 428/209 |
| 2017/0137660 A1* | 5/2017 | Sugiyama | C23C 18/20 |

OTHER PUBLICATIONS

International Search Report and Written Opinion dated Oct. 29, 2015 for International Application No. PCT/US2015/019524, 13 pages.

Extended Search Report dated Nov. 9, 2018 for European Application No. 15884847.3, 13 pages.

Gerd Esser et al., "Laser-assisted fabrication of electronic circuits using the ADDIMID process," Proceedings of SPIE, vol. 4274, Jun. 29, 2001, 11 pages.

P. Amend et al., "A fast and flexible method for manufacturing 3D molded interconnect devices by the use of a rapid prototyping technology," Physics Procedia, Elsevier, vol. 5, Jan. 1, 2010, 12 pages.

Adrien Brunet et al., "Moulded Interconnect Devices," Micro-Manufacturing Technologies and Their Applications, Jan. 31, 2017, 15 pages.

* cited by examiner

000# SELECTIVE METALLIZATION OF AN INTEGRATED CIRCUIT (IC) SUBSTRATE

CROSS REFERENCE TO RELATED APPLICATIONS

The present application is a national phase entry under 35 U.S.C. § 371 of International Application No. PCT/US2015/019524, filed Mar. 9, 2015, entitled "SELECTIVE METALLIZATION OF AN INTEGRATED CIRCUIT (IC) SUBSTRATE", which designated, among the various States, the United States of America. The Specifications of the PCT/US2015/019524 Application is hereby incorporated by reference.

FIELD

Embodiments of the present disclosure generally relate to the field of integrated circuit (IC) assemblies, and more particularly, to selective metallization of an IC substrate.

BACKGROUND

Electroless copper deposition generally utilizes a catalyst to initiate a copper deposition process. For example, in conventional techniques, a dielectric material may be roughened and exposed to the catalyst in ionic or colloidal solutions. The catalyst molecules may complex with the dielectric material and an activation step (e.g., application of a reducing chemistry such as dimethylamine borane (DMAB)) may be used to bring the catalyst to an ideal oxidation state to promote deposition activity. The activated substrate may then be exposed to a solution of the desired metal and reducing agent, resulting in deposition in areas with the catalyst. Techniques to deposit copper features in closer proximity to other copper features may be desirable as dimensions of circuitry on substrates continue to shrink.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe selective metallization of an IC substrate. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

Figure 1:
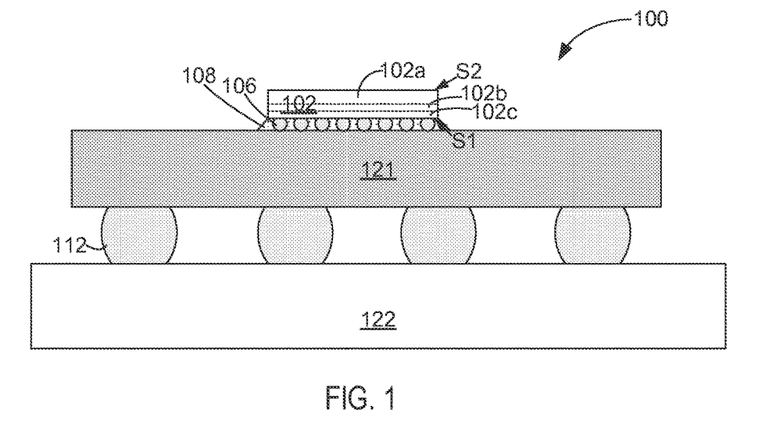
FIG. 1 schematically illustrates a cross-section side view of an example integrated circuit (IC) assembly, in accordance with some embodiments.

FIG. 1 schematically illustrates a cross-section side view of an example integrated circuit (IC) assembly 100, in accordance with some embodiments. In some embodiments, the IC assembly 100 may include one or more dies (hereinafter "die 102") electrically and/or physically coupled with an IC substrate 121 (sometimes referred to as a "package substrate"). In some embodiments, the IC substrate 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, SoC, or ASIC.

In some embodiments, an underfill material 108 (sometimes referred to as an "encapsulant") may be disposed between the die 102 and the IC substrate 121 to promote adhesion and/or protect features of the die 102 and IC substrate 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106.

The die 102 can be attached to the IC substrate 121 according to a wide variety of suitable configurations including, for example, being directly coupled with the IC substrate 121 in a flip-chip configuration, as depicted. In the flip-chip configuration, an active side, S1, of the die 102 including active circuitry is attached to a surface of the IC substrate 121 using die-level interconnect structures 106 such as bumps, pillars, or other suitable structures that may also electrically couple the die 102 with the IC substrate 121. The active side S1 of the die 102 may include transistor devices, and an inactive side, S2, may be disposed opposite to the active side S1, as can be seen.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

The IC substrate 121 may include electrical routing features (not shown in FIG. 1) such as, for example, traces, pads, through-holes, vias, or lines configured to route electrical signals to or from the die 102. For example, the IC substrate 121 may be configured to route electrical signals between the die 102 and the circuit board 122, or between the die 102 and another electrical component (e.g., another die, interposer, interface, component for wireless communication, etc.) coupled with the IC substrate 121. In some embodiments, the IC substrate 121 may comport with embodiments described herein for selective metallization. For example, the IC substrate 121 may be composed of a dielectric material having catalyst particles dispersed therein to facilitate formation of electrical routing features by electroless deposition. In some embodiments, the IC substrate 121 may be composed of build-up laminate layers of epoxy resin and the electrical routing features may be composed of copper. The IC substrate 121 and/or electrical routing features may be composed of other suitable materials in other embodiments.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin pre-preg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 602 of FIG. 6). The circuit board 122 may include metallization selectively deposited according to techniques and configurations described herein. That is, in some embodiments, the circuit board 122 may be referred to as an IC substrate.

Package-level interconnects such as, for example, solder balls 112 may be coupled with the IC substrate 121 and/or the circuit board 122 to form corresponding solder joints that are configured to further route the electrical signals between the IC substrate 121 and the circuit board 122. Other suitable techniques to physically and/or electrically couple the IC substrate 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

Figure 2:
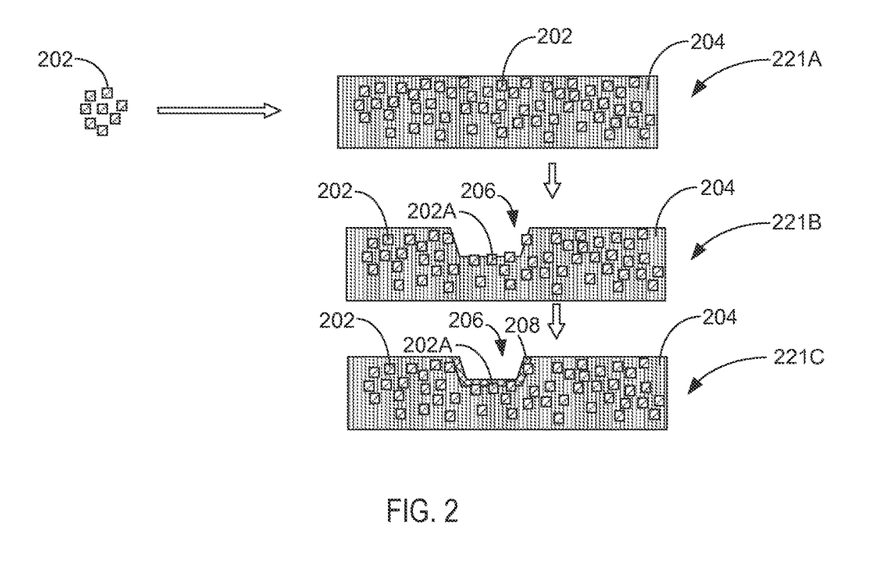
FIG. 2 schematically illustrates a cross-section side view of selective electroless deposition of a metal on an IC substrate, in accordance with some embodiments.

FIG. 2 schematically illustrates a cross-section side view of selective electroless deposition of a metal on an IC substrate, in accordance with some embodiments. According to various embodiments, catalytic particles 202 may be used to facilitate, promote or allow selective electroless deposition of a metal on the IC substrate. For example, in some embodiments, the catalytic particles 202 may include metal crystals. In other embodiments, the catalytic particles 202 may include a filler material, which may be a filler dielectric material in some embodiments.

In an embodiment where the catalytic particles 202 represent metal crystals, the catalytic particles 202 may represent cubic-shaped nanocrystals. Subject matter is not limited in this regard and the metal crystals may have a wide variety of other suitable polyhedral shapes in other embodiments including, for example, spheres, quasi-spheres, plates, octahedrons, and the like. Different shapes may expose different facets of the crystal, which may result in the crystal being more or less catalytically active for various reactions. Cubic nanocrystals may be rich with planar (100) facet density, which may provide a highly catalytically active facet for electroless deposition of copper.

In some embodiments, the metal crystals may include, for example, palladium (Pd), silver (Ag), gold (Au) and/or copper (Cu). In one embodiment, the metal crystals are Pd nanocubes. In some embodiments, the metal crystals may have a thickness ranging from 5 nanometers (nm) to 100 nm. The thickness may represent an average thickness of the metal crystals, in some embodiments. The metal crystals may include other suitable metals or combinations of metals and/or other thicknesses in other embodiments.

According to various embodiments, the metal crystals may be synthesized in a batch reaction. The metal crystals may be mixed with a dielectric material 204 of an IC substrate 221k For example, in some embodiments, the metal crystals may be mixed with epoxy material (e.g., resin) used in dielectric build-up layers and cured to create an IC substrate 221A with embedded metal crystals. In some embodiments, the metal crystals may be randomly and/or homogenously dispersed in the dielectric material 204. The dielectric material 204 may include other suitable materials in other embodiments.

The metal crystals may be bonded with a ligand, in some embodiments. The ligand may be bound to the surface of the metal crystals, in an embodiment, to maintain a shape of the metal crystals. In some embodiments, the ligand is formulated to ablate when exposed to laser light such that the metal crystals having the ablated ligand are activated to provide a catalyst for selective electroless deposition of a metal on the IC substrate 221A. The ligand may be composed of a small molecule (50 daltons to 400 daltons) or polymer such as, for example, alkyl-based quarternary ammonium cations (such as hexadecyltrimethylammonium or cetylpyridinium ion), alkanethiols (such as octanethiol, aminohexanethiol or benzenethiol) and/or polyvinylpyrrolidone and may be detectable by spectroscopy such as, for example, Raman spectroscopy. In some embodiments, the metal crystals may be detectable by scanning and/or transmission electron microscopy.

The IC substrate 221A having the metal crystals dispersed in the dielectric material 204 may be exposed to laser light to simultaneously form a recess such as a trench 206 and to ablate the ligand, thus exposing the metal crystals for catalytic action, as depicted in IC substrate 221B. Removing the ligand may activate the exposed metal crystals to provide a catalyst for electroless deposition of a metal where the exposed catalyst is disposed. The activated catalytic particles 202A may be disposed at an interface of the dielectric material 204 and a location where a metal layer 208 is to be formed. Prior to laser exposure, the catalytic particles 202 may be in an inactive state.

The IC substrate 221B may be immersed in an electroless solution resulting in selective deposition at locations where the exposed metal crystals are disposed (e.g., areas that have been patterned by laser ablation) to provide the IC substrate 221C. That is, a metal layer 208 such as, for example, a copper layer may only be deposited or may be much more favorably deposited where the exposed metal crystals (e.g., activated catalytic particles 202A) are disposed (e.g., in the trench 206). The exposed metal crystals may have a higher reaction rate. Exposed metal crystals may catalyze the deposition of the metal layer 208 from solution onto the IC substrate 221C, resulting in selective patterning that may be bound by the precision of the ablating laser. The metal layer 208 may be disposed on a surface of the IC substrate 221C. At least one or more of the exposed metal crystals may be disposed at an interface between the dielectric material 204 and the metal layer 208 and may be debonded from the ligand by the laser light that formed the trench 206. In some embodiments, the metal crystals may be catalytically active when embedded in the dielectric material 204 of the IC substrate 221A. For example, in some embodiments, the metal crystals may not be strongly bonded with a ligand or may not be bonded with a ligand at all.

In some embodiments, the catalytic particles 202 may represent filler material. The filler material may include, for example, aluminum nitride (AlN), alumina ($Al_2O_3$), strontium titanate ($SrTiO_3$), lead-titanium zirconate ($PbTi_{1-x}Zr_xO_3$), silicon carbide (SiC) or silver nitrate ($AgNO_3$), where x is a value ranging from 0 to 1. In some embodiments, the filler material may have a thickness from 2 nm to 2 microns. In one embodiment where fine filler size is desirable, the filler material may have a thickness from 2 nm to 20 nm. The thickness may represent an average thickness of particles of the filler material in some embodiments. The filler material may include other suitable materials and/or thicknesses in other embodiments. Prior to laser exposure, the catalytic particles 202 may be in an inactive state.

The filler material may be mixed into dielectric material 204 to provide an IC substrate 221A in a similar manner as described for the metal crystals. The filler material may be a photo-activated catalyst for electroless metal deposition (e.g., copper deposition). In some embodiments, the filler material (e.g., $Al_2O_3$, $SrTiO_3$, $PbTi_{1-x}Zr_xO_3$, or SIC) may be activated by formation of charged lattice vacancies (F-centers) upon exposure to laser light (e.g., ultraviolet laser). Such colour centers may serve as electron donors in a catalytic oxidation of formaldehyde in electroless deposition. In some embodiments, the filler material (e.g., $AgNO_3$) may be photo-activated as a catalyst by photo-induced reduction of silver nitrate to elemental silver (Ag). In some embodiments, the filler material may be catalytically activated by exposure to laser light that forms a recess such as a trench 206 in the IC substrate 221B. For example, the activated catalytic particles 202A may represent filler material that is exposed to laser light. Immersion in electroless solution may result in selective deposition of metal of the metal layer 208 (e.g., copper layer) in laser ablated areas such as trench 206.

In some embodiments, a Coefficient of Thermal Expansion (CTE) of the filler material may be selected or tuned to provide a dielectric material 204 that more closely matches a CTE of a die that is to be mounted on the IC substrate 221C. In some embodiments, the filler material (e.g., $Al_2O_3$, $SrTiO_3$, $PbTi_{1-x}Zr_xO_3$) may also serve as a high-K material to increase a dielectric constant of the dielectric material 204, e.g., for the intention of making areas with increased capacitance. In some embodiments, the filler material may be detectable using spectroscopy such as, for example, X-ray photoelectron spectroscopy (XPS), Energy-dispersive X-ray spectroscopy (EDS) or Raman spectroscopy to detect heavy metals of the filler material.

Figure 3:
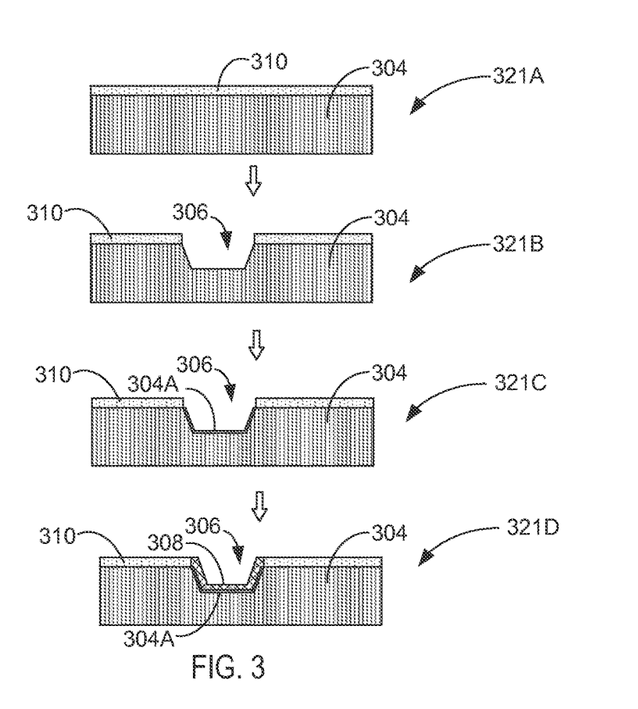
FIG. 3 schematically illustrates a cross-section side view of selective electroless deposition of a metal on an IC substrate having a protective layer, in accordance with some embodiments.

FIG. 3 schematically illustrates a cross-section side view of selective electroless deposition of a metal (e.g., metal layer 308) on an IC substrate (e.g., IC substrate 321D) having a protective layer 310, in accordance with some embodiments. According to various embodiments, an IC substrate 321A may include a dielectric material such as an epoxy material doped with catalytic particles (hereinafter "doped dielectric 304"). The doped dielectric 304 may include catalytic particles 202 as described in connection with FIG. 2 in some embodiments. For example, in some embodiments, the doped dielectric 304 may include a filler material having a maximum filler size less than 1 micron and/or an average filler size less than 0.3 microns.

In some embodiments, the protective layer 310 may be deposited on the doped dielectric 304 to facilitate masked selective patterning of a metal layer through electroless deposition. For example, the protective layer 310 may be disposed on the doped dielectric 304 to prevent electroless deposition of metal on the doped dielectric 304 when depositing the metal layer 308. The protective layer 310 may be a permanent feature of the IC substrate 321D in some embodiments.

In some embodiments, the protective layer 310 may be robust enough to withstand harsh chemical environments such as those associated with a desmear process, which may have a highly alkaline and strongly oxidative environment. For example, in some embodiments, the protective layer 310 may be composed of an epoxy-phenol or epoxy-imide blend with an ester-cyanate or ester-phenol based curing process. The protective layer 310 may be composed of other suitable materials in other embodiments.

According to various embodiments, the protective layer 310 may be free of filler material or may have fine filler sizes (e.g., maximum filler size being less than 100 nm) to avoid any potential side reactions with the electroless process. The protective layer 310 may have a thickness from 1 micron to 5 microns in some embodiments. The relatively small thickness of the protective layer 310 may help mitigate any CTE mismatch with adjacent layers or materials.

The protective layer 310 may be deposited using any suitable process. In some embodiments, deposition of the protective layer 310 may be accomplished by spin/slit coating, film lamination, or a bottom-up deposition technique.

Laser ablation may form a recess such as trench 306 through the protective layer 310 and the doped dielectric 304 to form IC substrate 321B. In embodiments where the doped dielectric 304 includes catalytic particles that are activated by laser light (e.g., a photo-activated filler material), the laser ablation may also simultaneously activate the catalytic particles at an interface of the doped dielectric 304 and the trench 306.

The IC substrate 321B may be immersed in an activation solution formulated to bring the catalytic particles in the doped dielectric 304 to an ideal oxidation state for maximum catalytic activity (e.g., activated layer 304A of IC substrate 321C). The IC substrate 321C may be immersed in an electroless solution such as, for example, copper salt, reducing agent and pH mediator in aqueous media to allow selective metal deposition of a metal layer 308 (e.g., copper layer) on the activated layer 304A within the trench 306 of the IC substrate 321D.

The protective layer 310 in a final product including the IC substrate 321C may be detected using any suitable technique. For example, in some embodiments, the protective layer 310 may be detected by scanning and/or transmission electron microscopy. Catalytic particles in the doped dielectric 304 may be detected by an ion analysis method such as ion chromatography or ion scattering spectroscopy (e.g., Rutherford backscattering, low energy ion scattering, and the like). Size of the catalytic particles or filler may be detected by scanning electron microscope (SEM) or transmission electron microscope (TEM).

Figure 4:
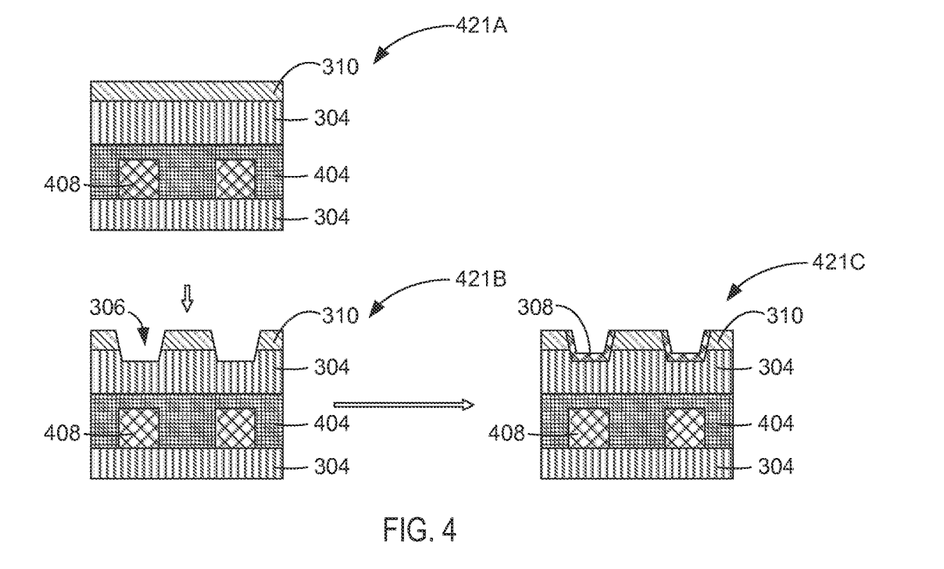
FIG. 4 schematically illustrates a cross-section side view of selective electroless deposition of a metal on an IC substrate having an underlying intermediate layer, in accordance with some embodiments.

FIG. 4 schematically illustrates a cross-section side view of selective electroless deposition of a metal (e.g., metal layer 308) on an IC substrate (e.g., IC substrate 421C) having an underlying intermediate layer (hereinafter "intermediate layer 404"), in accordance with some embodiments.

According to various embodiments, an intermediate layer 404 may be disposed between doped dielectric 304 layers, as can be seen in the IC substrate 421A, A protective layer 310 may be formed on the doped dielectric 304 and the intermediate layer 404 may include metal interconnect structures 408 (e.g., copper routing) embedded therein. The intermediate layer 404 may be formulated to maintain a viscosity to provide a more seamless interface between the metal interconnect structures 408 and the doped dielectric 304 disposed below the metal interconnect structures 408. In some embodiments, the intermediate layer 404 may be used together with doped dielectric 304 that is doped with fine filler material.

In some embodiments, the intermediate layer 404 may have a same or similar polymer composition as that of the doped dielectric 304. In some embodiments, the intermediate layer 404 does not include catalytic particles (e.g., dielectric filler material). The intermediate layer 404 may have an average filler (e.g., silicon filler) size that is greater than an average filler size of the doped dielectric 304 in order to lower the viscosity of the intermediate layer 404 to a value that allows planarity and seamless matching between the layers 304, 404. Viscosity may vary depending on aspect ratio of embedded interconnects and a thickness of build-up layers, which may vary from product to product. The viscosity may be tuned to balance the unwanted creation of voids at higher viscosity with unwanted creation of surface roughness at lower viscosity. For example, the intermediate layer 404 may include a filler having a greater average size than the metal crystals or filler material of the doped dielectric 304. Different filler sizes and an interface between the intermediate layer 404 and the doped dielectric 304 may be detected by SEM.

Patterning by laser light may be performed to form one or more recesses (e.g., trench 306) as depicted for IC substrate 421B and a metal layer 308 may be formed in the one or more recesses as depicted for IC substrate 421C. The patterning and deposition of the metal layer 308 may be performed according to techniques described in connection with FIG. 3 in some embodiments.

Figure 5:
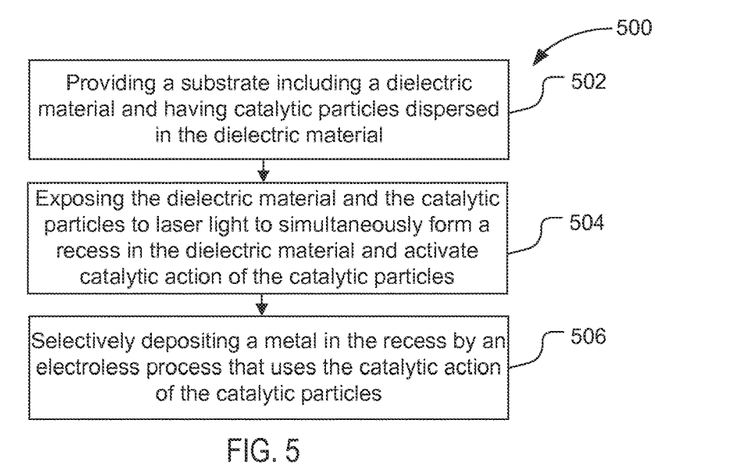
FIG. 5 schematically illustrates a flow diagram for a method of selective electroless deposition of a metal on an IC substrate, in accordance with some embodiments.

FIG. 5 schematically illustrates a flow diagram for a method 500 of selective electroless deposition of a metal (e.g., copper) on an IC substrate, in accordance with some embodiments. The method 500 may comport with techniques described in connection with FIGS. 1-4 and vice versa.

At 502, the method 500 may include providing a substrate (e.g., IC substrate 221A of FIG. 2) including a dielectric material (e.g., dielectric material 204 of FIG. 2) and having catalytic particles (e.g., catalytic particles 202 of FIG. 2) dispersed in the dielectric material. The catalytic particles may include, for example, metal crystals or filler material as described herein. In some embodiments, a protective layer (e.g., protective layer 310 of FIG. 3) may be formed on the substrate to facilitate selective electroless deposition of the metal in accordance with principles described in connection with FIG. 3. In some embodiments, the substrate may include an intermediate layer (e.g., intermediate layer 404 of FIG. 4) and associated structures described in connection with FIG. 4.

At 504, the method 500 may include exposing the dielectric material and the catalytic particles to laser light to simultaneously form a recess (e.g., trench 206 of FIG. 2) in the dielectric material and activate catalytic action of the catalytic particles. For example, in some embodiments, the catalytic particles may include metal crystals bonded with a ligand that is ablated when exposed to the laser such that the metal crystals are activated to provide the catalytic action for selective deposition of the metal. In other embodiments, the catalytic particles may include filler material that is photo-activated when exposed to the laser. Exposing the dielectric material and the catalytic particles to laser light may form a trench in the dielectric material in some embodiments.

At 506, the method 500 may include selectively depositing a metal (e.g., metal layer 208 of FIG. 2 or metal layer 308 of FIGS. 3-4) in the recess by an electroless process that uses the catalytic action of the catalytic particles. For example, copper may be selectively deposited on areas (e.g., the trench) of the substrate to form a copper layer where the catalytic particles have been activated by exposure to the laser light. In embodiments where a protective layer is formed on the dielectric material prior to exposing with laser light, the protective layer may inhibit deposition of the metal on the dielectric material when selectively depositing the metal. Various operations are described as multiple discrete operations in turn, in a manner that is most helpful in understanding the claimed subject matter. However, the order of description should not be construed as to imply that these operations are necessarily order dependent.

Figure 6:
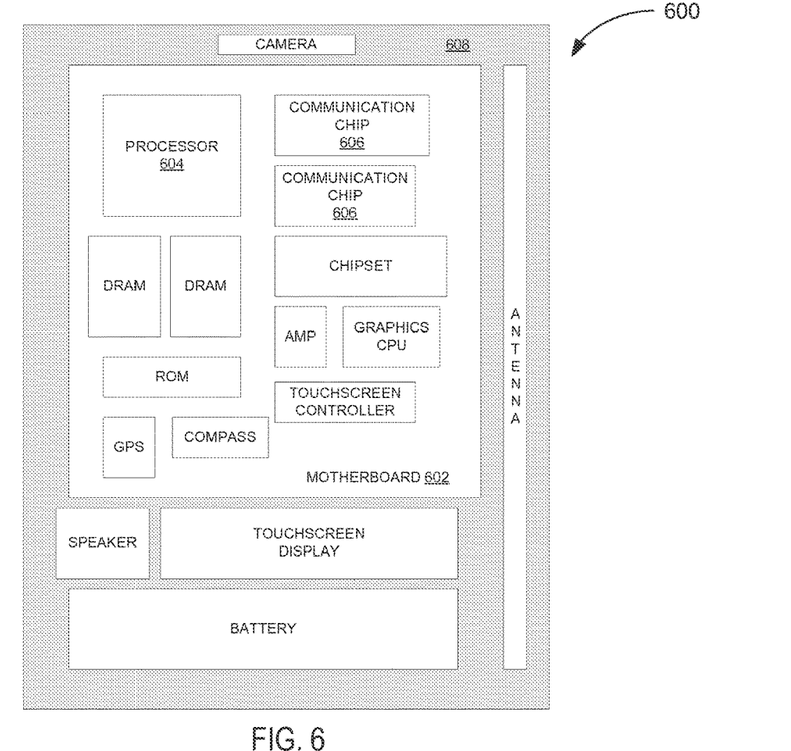
FIG. 6 schematically illustrates a computing device that includes an IC substrate as described herein, in accordance with some embodiments.

Embodiments of the present disclosure may be implemented into a system using any suitable hardware and/or software to configure as desired. FIG. 6 schematically illustrates a computing device 600 that includes an IC substrate (e.g., IC substrate 121 of FIG. 1, 221C of FIG. 2, 321D of FIG. 3, or 421C of FIG. 4) as described herein, in accordance with some embodiments. The computing device 600 may house a board such as motherboard 602 (e.g., in housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as WiGig, Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may be coupled with an IC substrate (e.g., IC substrate 121 of FIG. 1, 221C of FIG. 2, 321D of FIG. 3, or 421C of FIG. 4) as described herein. For example, the circuit board 122 of FIG. 1 may be a motherboard 602 and the processor 604 may be a die 102 mounted on IC substrate 121 of FIG. 1. The IC substrate 121 and the motherboard 602 may be coupled together using package-level interconnects such as solder balls 112. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 606 may also include a die (e.g., RF die) that may be coupled with an IC substrate (e.g., IC substrate 121 of FIG. 1, 221C of FIG. 2, 321D of FIG. 3, or

4210 of FIG. 4) as described herein. In further implementations, another component (e.g., memory device or other integrated circuit device) housed within the computing device 600 may include a die that may be coupled with an IC substrate (e.g., IC substrate 121 of FIG. 1, 2210 of FIG. 2, 321D of FIG. 3, or 421C of FIG. 4) as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 600 may be a mobile computing device in some embodiments. In further implementations, the computing device 600 may be any other electronic device that processes data.

EXAMPLES

According to various embodiments, the present disclosure describes an apparatus. Example 1 of an integrated circuit (IC) substrate may include a dielectric material and metal crystals having a polyhedral shape dispersed in the dielectric material and bonded with a ligand that is to ablate when exposed to laser light such that the metal crystals having the ablated ligand are activated to provide a catalyst for selective electroless deposition of a metal. Example 2 may include the IC substrate of Example 1, wherein the metal is copper, the IC substrate further comprising a copper layer disposed on a surface of the dielectric material, wherein at least one or more metal crystals having a polyhedral shape and disposed at an interface between the dielectric material and the copper layer are debonded from the ligand. Example 3 may include the IC substrate of Example 2, wherein the copper layer is disposed in a trench formed in the dielectric material. Example 4 may include the IC substrate of Example 3, further comprising a protective layer disposed on the dielectric material to prevent electroless deposition of copper on the dielectric material when depositing the copper layer. Example 5 may include the IC substrate of any of Examples 1-4, wherein the dielectric material comprises an epoxy resin. Example 6 may include the IC substrate of any of Examples 1-4, wherein the metal crystals include palladium (Pd), silver (Ag), gold (Au) or copper (Cu). Example 7 may include the IC substrate of Example 1, wherein the metal crystals have a thickness ranging from 5 nanometers (nm) to 100 nm. Example 8 may include the IC substrate of any of Examples 1-4, wherein the polyhedral shape includes a cubic or octahedral shape. Example 9 may include the IC substrate of any of Examples 1-4, wherein the ligand is a small molecule or polymer. Example 10 may include the IC substrate of any of Examples 1-4, wherein the dielectric material is part of a first dielectric layer disposed on a second dielectric layer, the second dielectric layer has a same polymer composition as the first dielectric layer, the second dielectric layer includes metal interconnect structures embedded in the second dielectric layer, the second dielectric layer does not include the metal crystals, and the second dielectric layer includes a filler having a greater average size than the metal crystals.

According to various embodiments, the present disclosure describes another apparatus. Example 11 of an integrated circuit (IC) substrate may include a dielectric material and a filler material dispersed in the dielectric material, wherein the filler material is to activate as a catalyst for selective electroless deposition of a metal when the filler material is exposed to laser light. Example 12 may include the IC substrate of Example 11, wherein the metal is copper, the IC substrate further comprising a copper layer disposed on a surface of the dielectric material, wherein at least some of the filler material disposed at an interface between the dielectric material and the copper layer has been activated as a catalyst for selective electroless deposition of copper. Example 13 may include the IC substrate of Example 12, wherein the copper layer is disposed in a trench formed in the dielectric material. Example 14 may include the IC substrate of Example 13, further comprising a protective layer disposed on the dielectric material to prevent electroless deposition of copper on the dielectric material when depositing the copper layer. Example 15 may include the IC substrate of any of Examples 11-14, wherein the dielectric material comprises an epoxy resin. Example 16 may include the IC substrate of any of Examples 11-14, wherein the filler material includes aluminum nitride (AlN), alumina ($Al_2O_3$), strontium titanate ($SrTiO_3$), lead-titanium zirconate ($PbTi_{1-x}Zr_xO_3$), silicon carbide (SEC) or silver nitrate ($AgNO_3$), where x is a value ranging from 0 to 1. Example 17 may include the IC substrate of any of Examples 11-14, wherein the filler material has a thickness ranging from 2 nanometers (nm) to 2 microns. Example 18 may include the IC substrate of any of Examples 11-14, wherein the dielectric material is part of a first dielectric layer disposed on a second dielectric layer, the second dielectric layer has a same polymer composition as the first dielectric layer, the second dielectric layer includes metal interconnect structures embedded in the second dielectric layer, the second dielectric layer does not include the filler material, and the second dielectric layer includes a filler having a greater average size than the filler material.

According to various embodiments, the present disclosure describes a method. Example 19 of a method may include providing a substrate including a dielectric material and having catalytic particles dispersed in the dielectric material, exposing the dielectric material and the catalytic particles to laser light to activate catalytic action of the catalytic particles, and selectively depositing copper by an electroless process that uses the catalytic action of the catalytic particles, wherein the copper is selectively deposited on areas of the substrate to form a copper layer where the catalytic particles have been activated by exposure to the laser light. Example 20 may include the method of Example 19, wherein exposing the dielectric material and the catalytic particles to laser light simultaneously forms a trench in the dielectric material and selectively depositing the copper includes selectively depositing the copper layer in the trench. Example 21 may include the method of Example 19, wherein the catalytic particles are metal crystals having a polyhedral shape dispersed in the dielectric material and bonded with a ligand that is ablated when exposed to the laser light such that the metal crystals having the ablated ligand are activated to provide the catalytic action for selectively depositing the copper. Example 22 may include the method of Example 21, wherein the metal crystals include palladium (Pd), silver (Ag), gold (Au) or copper (Cu). Example 23 may include the method of Example 19, wherein the catalytic particles are a filler material including aluminum nitride (AlN), alumina ($Al_2O_3$), strontium titanate ($SrTiO_3$), lead-titanium zirconate ($PbTi_{1-x}Zr_xO_3$), silicon carbide (SiC) or silver nitrate ($AgNO_3$), where x is a value ranging from 0 to 1. Example 24 may include the method of any of Examples 19-23, further comprising forming a protective layer on the dielectric material prior to exposing the dielectric material and the catalytic particles to the laser light to inhibit deposition of copper on the dielectric material when selectively depositing the copper.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) substrate comprising:
   a dielectric material; and
   metal crystals having a polyhedral shape dispersed in the dielectric material and bonded with a ligand that is to ablate when exposed to laser light such that the metal crystals having the ablated ligand are activated to provide a catalyst for selective electroless deposition of a metal, wherein the dielectric material is part of a first dielectric layer disposed on a second dielectric layer; the second dielectric layer has a same polymer composition as the first dielectric layer; the second dielectric layer includes metal interconnect structures embedded in the second dielectric layer; the second dielectric layer does not include the metal crystals; and the second dielectric layer includes a filler having a greater average size than the metal crystals.

2. The IC substrate of claim 1, wherein the metal is copper, the IC substrate further comprising:
   a copper layer disposed on a surface of the dielectric material, wherein at least one or more metal crystals having a polyhedral shape and disposed at an interface between the dielectric material and the copper layer are debonded from the ligand.

3. The IC substrate of claim 2, wherein the copper layer is disposed in a trench formed in the dielectric material.

4. The IC substrate of claim 3, further comprising a protective layer disposed on the dielectric material to prevent electroless deposition of copper on the dielectric material when depositing the copper layer.

5. The IC substrate of claim 1, wherein the dielectric material comprises an epoxy resin.

6. The IC substrate of claim 1, wherein the metal crystals include palladium (Pd), silver (Ag), gold (Au) or copper (Cu).

7. The IC substrate of claim 1, wherein the metal crystals have a thickness ranging from 5 nanometers (nm) to 100 nm.

8. The IC substrate of claim 1, wherein the polyhedral shape includes a cubic or octahedral shape.

9. The IC substrate of claim 1, wherein the ligand is a small molecule or polymer.

10. An integrated circuit (IC) substrate comprising:
    a dielectric material; and
    a filler material dispersed in the dielectric material, wherein the filler material is to activate as a catalyst for selective electroless deposition of a metal when the filler material is exposed to laser light, wherein the dielectric material is part of a first dielectric layer disposed on a second dielectric layer; the second dielectric layer has a same polymer composition as the first dielectric layer; the second dielectric layer includes metal interconnect structures embedded in the second dielectric layer; the second dielectric layer does not include the filler material; and the second dielectric layer includes a filler having a greater average size than the filler material.

11. The IC substrate of claim 10, wherein the metal is copper, the IC substrate further comprising:
    a copper layer disposed on a surface of the dielectric material, wherein at least some of the filler material disposed at an interface between the dielectric material and the copper layer has been activated as a catalyst for selective electroless deposition of copper.

12. The IC substrate of claim 11, wherein the copper layer is disposed in a trench formed in the dielectric material.

13. The IC substrate of claim 12, further comprising a protective layer disposed on the dielectric material to prevent electroless deposition of copper on the dielectric material when depositing the copper layer.

14. The IC substrate of claim 10, wherein the dielectric material comprises an epoxy resin.

15. The IC substrate of claim 10, wherein the filler material includes aluminum nitride (AlN), alumina ($Al_2O_3$), strontium titanate ($SrTiO_3$), lead-titanium zirconate ($PbTi_{1-x}Zr_xO_3$), silicon carbide (SiC) or silver nitrate ($AgNO_3$), where x is a value ranging from 0 to 1.

16. The IC substrate of claim 10, wherein the filler material has a thickness ranging from 2 nanometers (nm) to 2 microns.

17. A method comprising:
    providing a substrate including a dielectric material and having catalytic particles dispersed in the dielectric material, wherein the dielectric material is part of a first dielectric layer disposed on a second dielectric layer; the second dielectric layer has a same polymer composition as the first dielectric layer; the second dielectric layer includes metal interconnect structures embedded in the second dielectric layer; the second dielectric layer does not include the metal crystals; and the second dielectric layer includes a filler having a greater average size than the metal crystals;
    exposing the dielectric material and the catalytic particles to laser light to activate catalytic action of the catalytic particles; and
    selectively depositing a metal by an electroless process that uses the catalytic action of the catalytic particles, wherein the metal is selectively deposited on areas of the substrate to form a metal layer where the catalytic particles have been activated by exposure to the laser light, wherein the selectively deposited metal includes copper.

18. The method of claim 17, wherein:
exposing the dielectric material and the catalytic particles to laser light simultaneously forms a trench in the dielectric material; and
selectively depositing the metal includes selectively depositing the metal layer in the trench.

19. The method of claim 17, wherein the catalytic particles are metal crystals having a polyhedral shape dispersed in the dielectric material and bonded with a ligand that is ablated when exposed to the laser light such that the metal crystals having the ablated ligand are activated to provide the catalytic action for selectively depositing the metal.

20. The method of claim 19, wherein the metal crystals include palladium (Pd), silver (Ag), gold (Au) or copper (Cu).

21. The method of claim 17, wherein the catalytic particles are a filler material including aluminum nitride (AlN), alumina ($Al_2O_3$), strontium titanate ($SrTiO_3$), lead-titanium zirconate ($PbTi_{1-x}Zr_xO_3$), silicon carbide (SiC) or silver nitrate ($AgNO_3$), where x is a value ranging from 0 to 1.

22. The method of claim 17, further comprising:
forming a protective layer on the dielectric material prior to exposing the dielectric material and the catalytic particles to the laser light to inhibit deposition of the metal on the dielectric material when selectively depositing the metal.

* * * * *